(12) United States Patent
Tsujimoto et al.

(10) Patent No.: US 8,277,673 B2
(45) Date of Patent: Oct. 2, 2012

(54) PLASMA PROCESSING METHOD AND APPARATUS

(75) Inventors: Hiroshi Tsujimoto, Nirasaki (JP); Toshifumi Nagaiwa, Nirasaki (JP); Yuji Otsuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 474 days.

(21) Appl. No.: 12/533,700

(22) Filed: Jul. 31, 2009

(65) Prior Publication Data

US 2010/0025372 A1 Feb. 4, 2010

(30) Foreign Application Priority Data

Aug. 1, 2008 (JP) ................. 2008-199429

(51) Int. Cl.
- C03C 15/00 (2006.01)
- C03C 25/68 (2006.01)
- H05H 1/24 (2006.01)

(52) U.S. Cl. .............. 216/67; 216/58; 427/569

(58) Field of Classification Search .............. 156/345.44
See application file for complete search history.

(56) References Cited

U.S. PATENT DOCUMENTS

| | | | |
|---|---|---|---|
| 5,997,962 A * | 12/1999 | Ogasawara et al. ............. 216/67 |
| 6,373,681 B2 * | 4/2002 | Kanno et al. .................. 361/234 |
| 2005/0095732 A1 | 5/2005 | Maebashi et al. | |
| 2005/0142873 A1 | 6/2005 | Shindo et al. | |
| 2008/0179011 A1 * | 7/2008 | Collins et al. ............ 156/345.44 |

FOREIGN PATENT DOCUMENTS

| | | |
|---|---|---|
| JP | 2005-123578 | 5/2005 |
| JP | 2007-208302 | 8/2007 |

* cited by examiner

*Primary Examiner* — Shamim Ahmed
*Assistant Examiner* — Bradford Gates
(74) *Attorney, Agent, or Firm* — Oblon, Spivak, McClelland, Maier & Neustadt, L.L.P.

(57) ABSTRACT

In a plasma processing method, a conductor of an electrostatic chuck (ESC) and an electrode are electrically grounded prior to starting the plasma processing. A DC voltage with a polarity is applied to the conductor at a first time point after loading a substrate on the electrode. Then, the electrode is switched from an electrically grounded state to an electrically floating state at a second time point. A RF power is then applied to the electrode at a third time point. The application of the RF power is stopped at a fourth time point after a specified time has lapsed from the third time point. Then, the electrode is switched from the electrically floating state to the electrically grounded state at a fifth time point. Thereafter, the application of the DC voltage is stopped and the conductor is restored to a ground potential at a sixth time point.

10 Claims, 11 Drawing Sheets

(t=t₀)

(t=t₁)

(t=t₆)

(t=t₈)

(t=t9)

(t=t10)

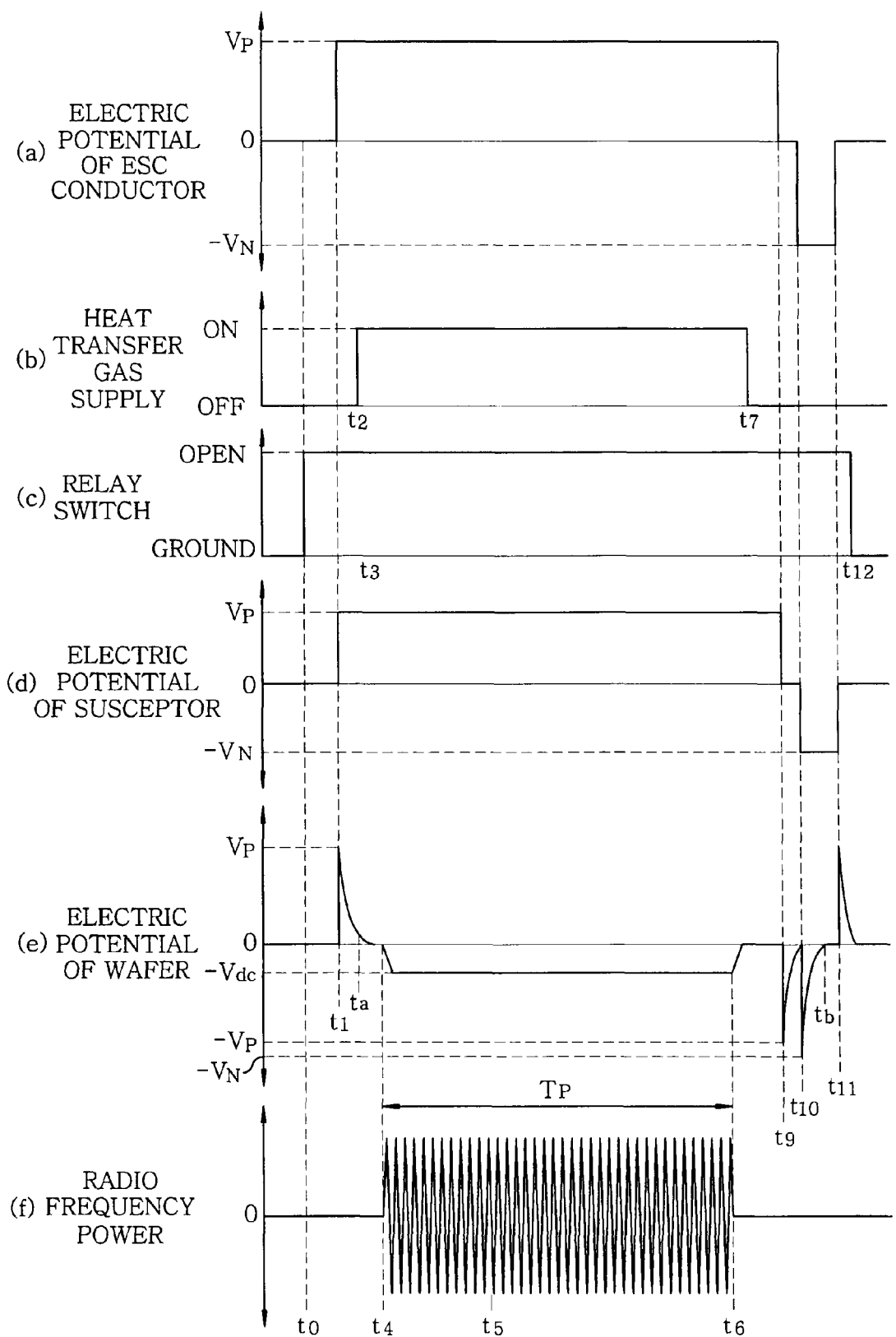

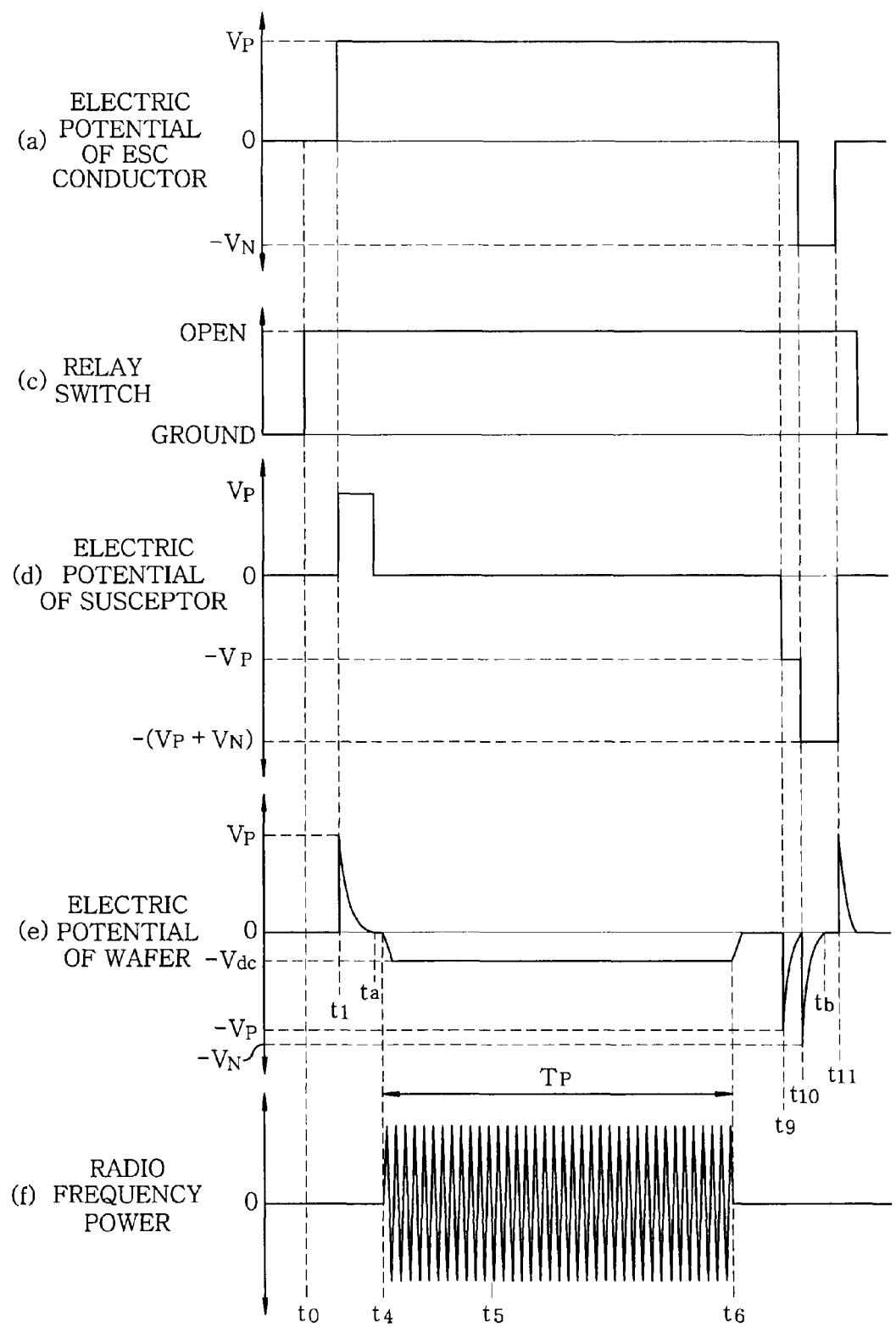

PLASMA PROCESSING METHOD AND APPARATUS

FIELD OF THE INVENTION

The present invention relates to a technique of subjecting a target substrate to plasma processing and, more specifically, to a single sheet plasma processing method and apparatus that makes use of an electrostatic chuck to hold a substrate on a radio frequency (RF) electrode within a processing chamber.

BACKGROUND OF THE INVENTION

In a single sheet plasma processing apparatus, it is typical that, within an evacuatable processing chamber, a target substrate (e.g., a semiconductor wafer) is mounted on a mounting table called a susceptor or other names and is subjected to plasma processing such as dry etching, oxidizing, depositing or the like.

In general, the susceptor serving as a radio frequency (RF) electrode is made of a material with superior conductivity and workability, e.g., aluminum, and is attached within the processing chamber in a non-grounded state, namely in an electrically floating state. During the plasma processing process, a RF power supply arranged outside the processing chamber applies a RF power of a specified frequency to the susceptor via a matching unit.

In a mechanical aspect, lift pins for loading an unprocessed substrate to the susceptor and unloading a processed substrate from the susceptor are movable upwards and downwards through the susceptor.

In order to control the temperature of the substrate under plasma processing, a coolant flow path for cooling and a heating element for heating are provided within the susceptor. For efficient thermal transfer from the susceptor to the substrate in this case, a heat transfer gas (typically, a helium gas) is supplied at a predetermined pressure to the rear surface of the substrate through a gas flow path formed in the susceptor.

The plasma processing apparatus using the susceptor as set forth above includes an electrostatic chuck unitarily formed with the major surface, i.e., the substrate mounting surface, of the susceptor for holding the substrate on the susceptor (see, e.g., Japanese Patent Laid-open Application No. 2005-123578 and corresponding U.S. Patent Application Publication No. 2005-95732A). The electrostatic chuck of this kind has a structure in which a thin conductor (electrode) is encapsulated within a dielectric film. A high DC voltage of, e.g., 2 to 3 kV, is applied to the conductor to generate an electrostatic force in the substrate mounted on the susceptor, thereby attracting and holding the substrate with a Coulomb force.

With the plasma processing apparatus in which the susceptor serves as a RF electrode as noted above, there is a problem in that, if the high DC voltage is applied to the conductor of the electrostatic chuck prior to starting the plasma processing process, the gas (especially, the heat transfer gas) undergoes abnormal electric discharge between the substrate and the susceptor immediately after the voltage application, which makes the substrate susceptible to damage (at least with random probability).

More specifically, the electrostatic chuck is provided with through-holes through which to pass the lift pins and the heat transfer gas. These through-holes form gas spaces between the substrate and the susceptor. If the high DC voltage is applied to the conductor of the electrostatic chuck, the electric potential of the substrate and the susceptor is instantly increased by electrostatic induction up to substantially the same electric potential as the high DC voltage. Just after then, the electric charges of static electricity flow from the substrate to a chamber sidewall or an upper electrode, which is kept at a ground potential, through the processing space defined within the processing chamber. Thus, the electric potential of the substrate is decreased to the ground potential. On the other hand, the electric charges of static electricity continue to stay in the susceptor so that the electric potential of the susceptor is kept at the same level as that of the high DC voltage. Therefore, almost the same voltage as the high DC voltage is applied to the gas present in the through-holes of the electrostatic chuck between the substrate and the susceptor. Abnormal electric discharge occurs if the discharge-starting conditions under Paschen's Law are satisfied.

DISCLOSURE OF THE INVENTION

In view of the above, the present invention provides a plasma processing method and apparatus capable of reliably preventing occurrence of abnormal electric discharge which would otherwise occur in the through-holes of an electrostatic chuck between a RF electrode serving as a substrate mounting table and a target substrate, thereby improving the yield rate in a plasma processing process.

In accordance with a first aspect of the invention, there is provided a plasma processing method for holding a target substrate on a first electrode with an electrostatic attracting force within an evacuatable processing chamber by use of an electrostatic chuck provided in the first electrode and applying a first radio frequency (RF) power to the first electrode to perform desired plasma processing on the substrate, the electrostatic chuck including a dielectric film and a conductor encapsulated within the dielectric film, the method including: electrically grounding the conductor of the electrostatic chuck and the first electrode prior to starting the plasma processing; loading the substrate on the first electrode by operating a lift pin movable through the first electrode and the electrostatic chuck; starting application of a first direct current voltage with a first polarity to the conductor of the electrostatic chuck at a first time point after loading the substrate on the first electrode; switching the first electrode from an electrically grounded state to an electrically floating state at a second time point subsequent to the first time point; starting application of the first RF power to the first electrode at a third time point subsequent to the second time point; stopping application of the first RF power to the first electrode at a fourth time point after a specified time has lapsed from the third time point; switching the first electrode from the electrically floating state to the electrically grounded state at a fifth time point subsequent to the fourth time point; stopping application of the first direct current voltage to the conductor of the electrostatic chuck and restoring the conductor to a ground potential at a sixth time point subsequent to the fifth time point; and unloading the substrate from the first electrode by operating the lift pin at a seventh time point subsequent to the sixth time point.

In accordance with a second aspect of the invention, there is provided a plasma processing apparatus including: an evacuatable processing chamber; a first electrode for mounting a target substrate thereon within the processing chamber; a first RF power supply for outputting a first RF power to be applied to the first electrode during plasma processing; an electrostatic chuck provided in the first electrode, the electrostatic chuck including a dielectric film and a conductor encapsulated within the dielectric film; a first direct current power supply for outputting a first direct current voltage with a first polarity to generate an electrostatic attracting force in the electrostatic chuck; a first switch for selectively switching the conductor of the electrostatic chuck to one of a ground potential terminal and the first direct current power supply; a second switch for selectively switching the first electrode to one of an electrically grounded state and an electrically floating state; a lift pin provided for up-and-down movement through the first electrode; a lift pin operating unit for causing the lift pin to make up-and-down movement to load and unload the substrate on and from the first electrode; a processing gas supply unit for supplying a desired processing gas into the processing chamber; and a control unit for controlling the first and second switches to electrically ground the conductor of the electrostatic chuck and the first electrode prior to starting the plasma processing, for controlling the lift pin operating unit to operate the lift pin so that the substrate is loaded on the first electrode, for controlling the first switch to start application of the first direct current voltage to the conductor of the electrostatic chuck at a first time point after loading the substrate on the first electrode, for controlling the second switch to switch the first electrode from an electrically grounded state to an electrically floating state at a second time point subsequent to the first time point, for controlling the first RF power supply to start application of the first RF power to the first electrode at a third time point subsequent to the second time point, for controlling the first RF power supply to stop application of the first RF power to the first electrode at a fourth time point after a specified time has lapsed from the third time point, for controlling the second switch to switch the first electrode from the electrically floating state to the electrically grounded state at a fifth time point subsequent to the fourth time point, for controlling the first switch to stop application of the first direct current voltage to the conductor of the electrostatic chuck and to restore the conductor to a ground potential at a sixth time point subsequent to the fifth time point, and for controlling the lift pin operating unit to operate the lift pin and to unload the substrate from the first electrode at a seventh time point subsequent to the sixth time point.

In the present invention, the first electrode is electrically grounded when starting application of the first direct current voltage to the conductor of the electrostatic chuck at the first time point after loading the substrate on the first electrode. As a result, the electric potential of the conductor is increased and the electric potential of the substrate is also increased by electrostatic induction to a value substantially equal to the first direct current voltage, with the electric potential of the first electrode kept at the ground potential. In this regard, the substrate electric potential is increased at a moment and electric charges flow out immediately from the substrate so that the substrate electric potential can be restored to the ground potential. Thanks to these features, there is no possibility that a high direct current voltage equivalent to the first direct current voltage is developed between the substrate and the first electrode. This eliminates the possibility that abnormal electric discharge occurs in the gas spaces between the substrate and the first electrode (in the through-holes of the electrostatic chuck).

In the present invention, the first electrode is first switched from the electrically floating state to the electrically grounded state at the fifth time point after termination of the plasma processing. Then, the application of the first direct current voltage to the conductor of the electrostatic chuck is stopped at the sixth time point to restore the electric potential of the substrate to the ground potential. As a consequence, the electric potential of the conductor is decreased and the electric potential of the substrate is also decreased by electrostatic induction from the ground potential to a negative electric potential substantially equal to the first direct current voltage, with the electric potential of the first electrode kept at the ground potential. In this regard, the substrate electric potential is decreased at a moment and electric charges flow out immediately from the substrate so that the substrate electric potential can be restored to the ground potential. Thanks to these features, there is no possibility that a high direct current voltage equivalent to the first direct current voltage is developed between the substrate and the first electrode. This eliminates the possibility that abnormal electric discharge occurs in the gas spaces between the substrate and the first electrode (in the through-holes of the electrostatic chuck).

In the plasma processing apparatus of the present invention, there may be provided a temperature control unit for controlling the temperature of the first electrode to a desired value to control the temperature of the substrate during the plasma processing and a heat transfer gas supply unit for supplying a heat transfer gas to a back surface of the substrate through gas passages formed in the first electrode and the electrostatic chuck to transfer the temperature of the first electrode to the substrate. In this case, the control unit controls the heat transfer gas supply unit to start the supply of the heat transfer gas between the first time point and the second time point and to stop the supply of the heat transfer gas between the fourth time point and the fifth time point.

In order to rapidly remove static electricity from the substrate within a shortened period time after the plasma processing, there may also be provided a second direct current power supply for outputting a second direct current voltage with a second polarity, the second direct current power supply being electrically connectable to the conductor of the electrostatic chuck through the first switch. In this case, the control unit controls the second switch so that the second direct current voltage can be applied from the second direct current power supply to the conductor of the electrostatic chuck between the sixth time point and the seventh time point, after which the substrate is restored to a ground potential.

With the plasma processing method and apparatus of the present invention, use of the above-noted configuration and operation makes it possible to reliably prevent occurrence of abnormal electric discharge which would otherwise occur in the through-holes of the electrostatic chuck between the RF electrode serving as the substrate mounting table and the target substrate, thereby improving the yield rate in the plasma processing process.

BRIEF DESCRIPTION OF THE DRAWINGS

The objects and features of the present invention will become apparent from the following description of embodiments, given in conjunction with the accompanying drawings, in which:

FIG. 5 shows waveform charts (mainly, waveform charts of electric potential) for the respective parts of the apparatus during the first sheet processing process performed according to a comparative example; and FIG. 6 shows waveform charts (mainly, waveform charts of electric potential) for the respective parts of the apparatus during the first sheet processing process performed according to a comparative example, which waveform charts are directed to a case where abnormal electric discharge occurs at the starting time of the plasma processing process.

DETAILED DESCRIPTION OF THE PREFERRED EMBODIMENTS

Hereinafter, preferred embodiments of the present invention will be described with reference to the accompanying drawings which form a part hereof.

Figure 1:
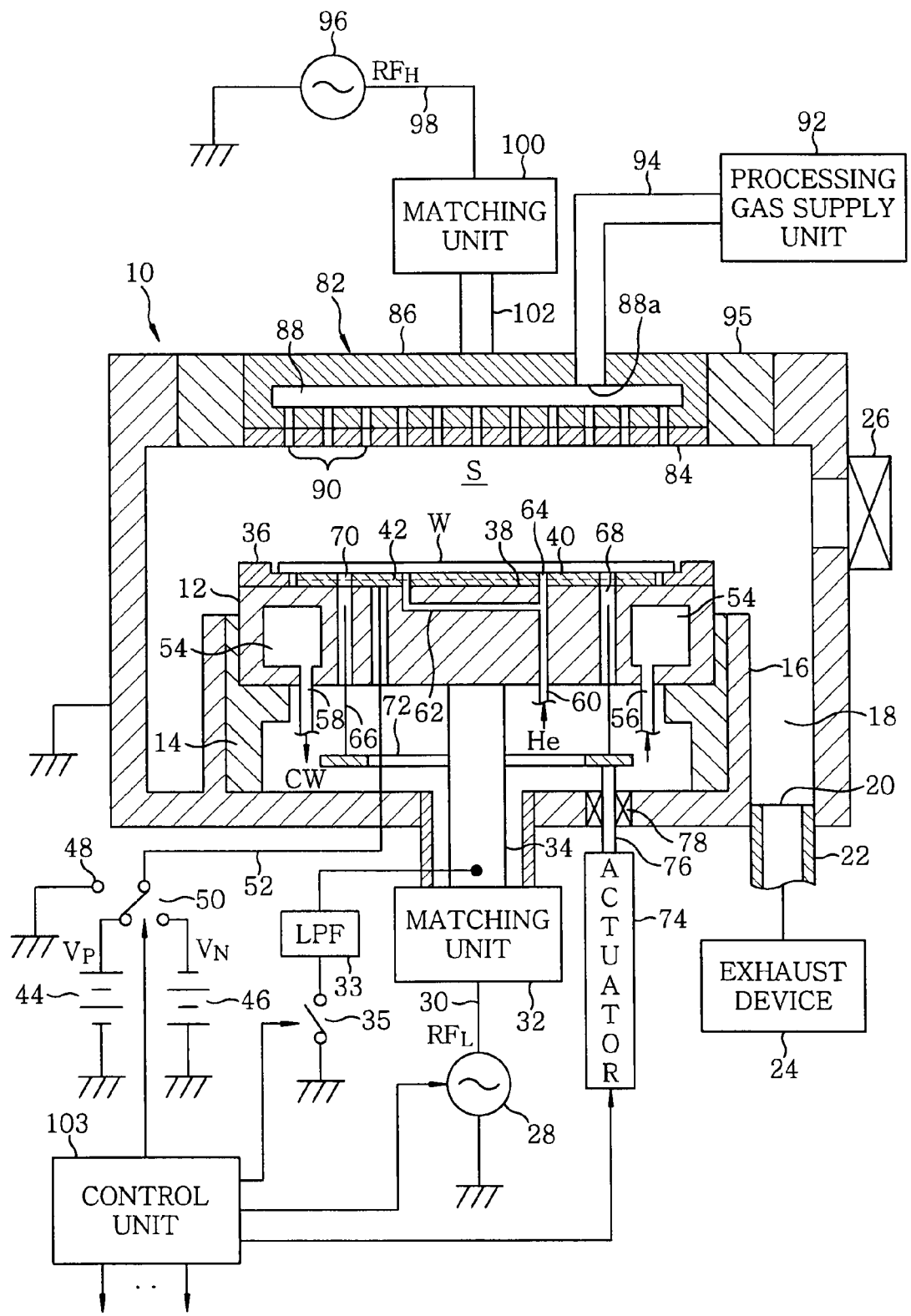
FIG. 1 is a vertical section view showing the configuration of a plasma etching apparatus in accordance with one embodiment of the present invention.
Figure 2:
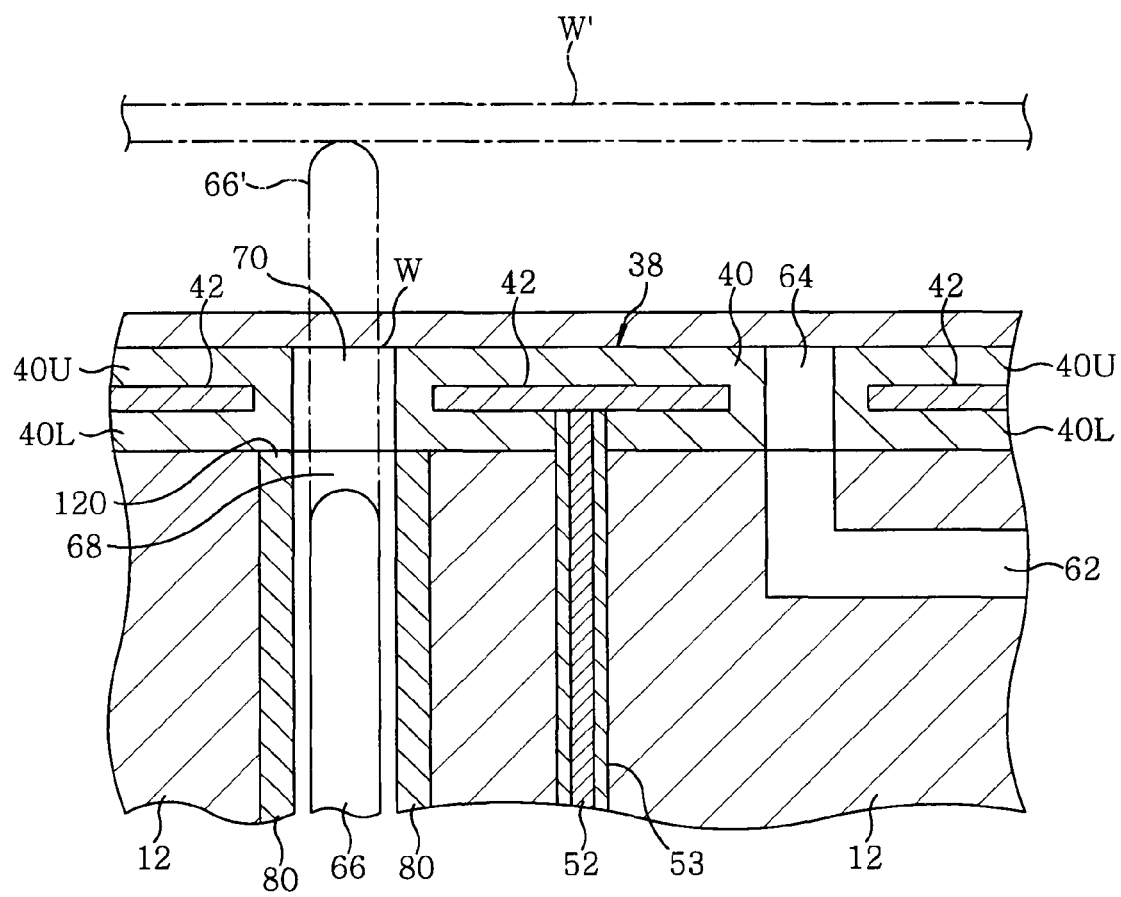
FIG. 2 is a partially enlarged section view showing the configuration of an electrostatic chuck (ESC) and its vicinity in the plasma etching apparatus of the present embodiment.

FIGS. 1 and 2 show the configuration of a plasma processing apparatus in accordance with one embodiment of the present invention. FIG. 1 is a view showing the entirety of the plasma processing apparatus, and FIG. 2 is a partially enlarged section view showing an electrostatic chuck and its vicinity.

This plasma processing apparatus is a capacity-coupled parallel plate type plasma etching apparatus. The plasma processing apparatus includes a cylindrical chamber (processing vessel) 10 made of metal, e.g., aluminum or stainless steel. The chamber 10 is electrically grounded for the purpose of safety.

A susceptor 12 of disk shape or cylindrical columnar shape for supporting a target substrate, e.g., a semiconductor wafer W, is horizontally arranged within the chamber 10 as a lower electrode. The susceptor 12 is made of, e.g., aluminum, and is supported by an insulating tubular support portion 14 in a non-grounding state, i.e., in an electrically floating state (particularly, a DC-floating state). The tubular support portion 14 extends vertically upwards from the bottom of the chamber 10 and is made of, e.g., ceramic. A conductive tubular inner wall portion 16 extends vertically upwards from the bottom of the chamber 10 along the outer circumference of the tubular support portion 14. An annular exhaust passageway 18 is formed between the inner wall portion 16 and the sidewall of the chamber 10. An exhaust port 20 is provided in the bottom of the exhaust passageway 18. An exhaust device 24 is connected to the exhaust port 20 through an exhaust pipe 22. The exhaust device 24 includes a vacuum pump, e.g., a turbo molecular pump, and is able to depressurize the processing space within the chamber 10 to a desired vacuum degree. A gate valve 26 for opening and closing a gateway through which to load and unload a semiconductor wafer W is provided to the sidewall of the chamber 10.

A radio frequency (RF) power supply 28 is electrically connected to the susceptor 12 via a RF cable 30, a lower matching unit 32 and a lower power-feeding rod 34. The RF power supply 28 is designed to output bias-controlling RF power $RF_L$ having a frequency (of 13.56 MHz or less in typical cases) suitable for controlling the energy of ions attracted from plasma to the semiconductor wafer W on the susceptor 12 during a plasma etching process.

The lower power-feeding rod 34 is electrically connected to a ground potential terminal through a low-pass filter 33 and a relay switch 35. When the relay switch 35 is in an off-state (or an open state), the lower power-feeding rod 34 and the susceptor 12 are kept in a direct current floating state. If the relay switch 35 comes into an on-state (or a closed state), the lower power-feeding rod 34 and the susceptor 12 are DC-grounded.

The low-pass filter 33 is used to reliably prevent leakage of the RF power from the lower power-feeding rod 34 toward the relay switch 35. The low-pass filter 33 and the relay switch 35 may be provided inside the housing of the lower matching unit 32.

The susceptor 12 has a diameter slightly greater than that of the semiconductor wafer W. The semiconductor wafer W to be processed is mounted on the upper surface of the susceptor 12. A focus ring 36 is attached so as to surround the semiconductor wafer W. Depending on the kinds of the processed materials of the semiconductor wafer W, the focus ring 36 is made of, e.g., one of Si, SiC, C and $SiO_2$.

On the upper surface of the susceptor 12, there is installed an electrostatic chuck (ESC) 38 for attracting and holding the semiconductor wafer W. The electrostatic chuck 38 is fabricated by embedding a sheet-like or mesh-like conductor (electrode) 42 into a film-like or plate-like dielectric body 40 (see FIG. 2) and is integrally formed with or fixedly secured to the upper surface of the susceptor 12. A positive direct current power supply 44 for the generation of an electrostatic attracting force, a negative direct current power supply 46 for the removal of electricity or a ground potential terminal 48, each of which is arranged outside the chamber 10, can be electrically connected to the conductor 42 through a selector switch 50 and a high-voltage line 52. The high-voltage line 52 extending within the susceptor 12 is insulation-coated with an insulating body 53 of, e.g., sheath shape (see FIG. 2).

An annular coolant cavity or coolant flow path 54 extending, e.g., in the circumferential direction of the susceptor 12 is formed within the susceptor 12. Coolant, e.g., cooling water CW, of a specified temperature is supplied from a chiller unit (not shown) to the coolant cavity 54 and is circulated through pipelines 56 and 58. The temperature of the susceptor 12 can be controlled to become a specified temperature by controlling the temperature and flow rate of the cooling water CW. With a view to control the temperature of the susceptor 12 and hence the temperature of the semiconductor wafer W, a heat transfer gas, e.g., He gas, is supplied at a predetermined pressure from a heat transfer gas supply unit (not shown) to the back surface of the semiconductor wafer W through a gas supply pipe 60, gas passages 62 within the susceptor 12 and gas discharge holes 64 of the electrostatic chuck 38.

Through-holes 68 and 70 are formed in the susceptor 12 and the electrostatic chuck 38, respectively. A plurality of (e.g., three) lift pins 66 used in loading and unloading the semiconductor wafer W placed on the susceptor 12 extend through the through-holes 68 and 70 in a vertically movable manner. The lift pins 66 are made of an insulating material, e.g., resin or ceramic, and are supported by an annular horizontal lift plate 72. The horizontal lift plate 72 is coupled to the up-and-down drive shaft 76 of an actuator 74 including an air cylinder, a ball screw mechanism or the like.

A hole through which to pass the up-and-down drive shaft 76 is formed in the bottom wall of the chamber 10 and is sealed up by a seal member 78 with a guide function. The inner wall of each of the through-holes 68 through which to pass the lift pins 66 is covered with a sheath-shaped or tubular insulating body 80 made of, e.g., resin or ceramic (see FIG. 2).

In the ceiling of the chamber 10, there is provided a shower head 82 that faces the susceptor 12 in a parallel relationship therewith and serves as an upper electrode. The shower head 82 includes an electrode plate 84 opposing the susceptor 12 and an electrode support body 86 for detachably holding the electrode plate 84 at the rear side (or the upper side) thereof. A gas cavity 88 is provided within the electrode support body 86. Gas injection holes 90 extending from the gas cavity 88 toward the susceptor 12 are formed in the electrode support body 86 and the electrode plate 84.

The space S defined between the electrode plate 84 and the susceptor 12 is used as a plasma-generating space or a processing space. A gas inlet port 88a is provided above the gas cavity 88 and a gas supply pipe 94 extending from a gas supply unit 92 is connected to the gas inlet port 88a. The electrode plate 84 is made of, e.g., Si, SiC or C and the electrode support body 86 is made of, e.g., alumite-treated aluminum.

An annular insulating body 95 made of, e.g., alumina, is air-tightly fitted between the shower head 82 and the upper opening edge portion of the chamber 10. The shower head 82 is attached to the chamber 10 in an electrically non-grounded state. An additional RF power supply 96 is electrically connected to the shower head (or the upper electrode) 82 through a RF cable 98, an upper matching unit 100 and an upper power supply rod 102. The RF power supply 96 outputs, at specified power, RF power $RF_H$ having a frequency suitable for RF discharge, i.e., for plasma generation (preferably, 40 MHz or more).

A control unit 103 includes a microcomputer and various kinds of interfaces. According to the software (programs) and recipe information stored in an external memory or an internal memory, the control unit 103 controls the operations of the respective parts arranged in the plasma etching apparatus, e.g., the exhaust device 24, the RF power supplies 28 and 96, the matching units 32 and 100, the switches 35 and 50, the actuator 74 of the lift mechanism, the chiller unit (not shown), the heat transfer gas supply unit (not shown) and the processing gas supply unit 92, and the overall operation (sequences) of the apparatus.

Figure 3:
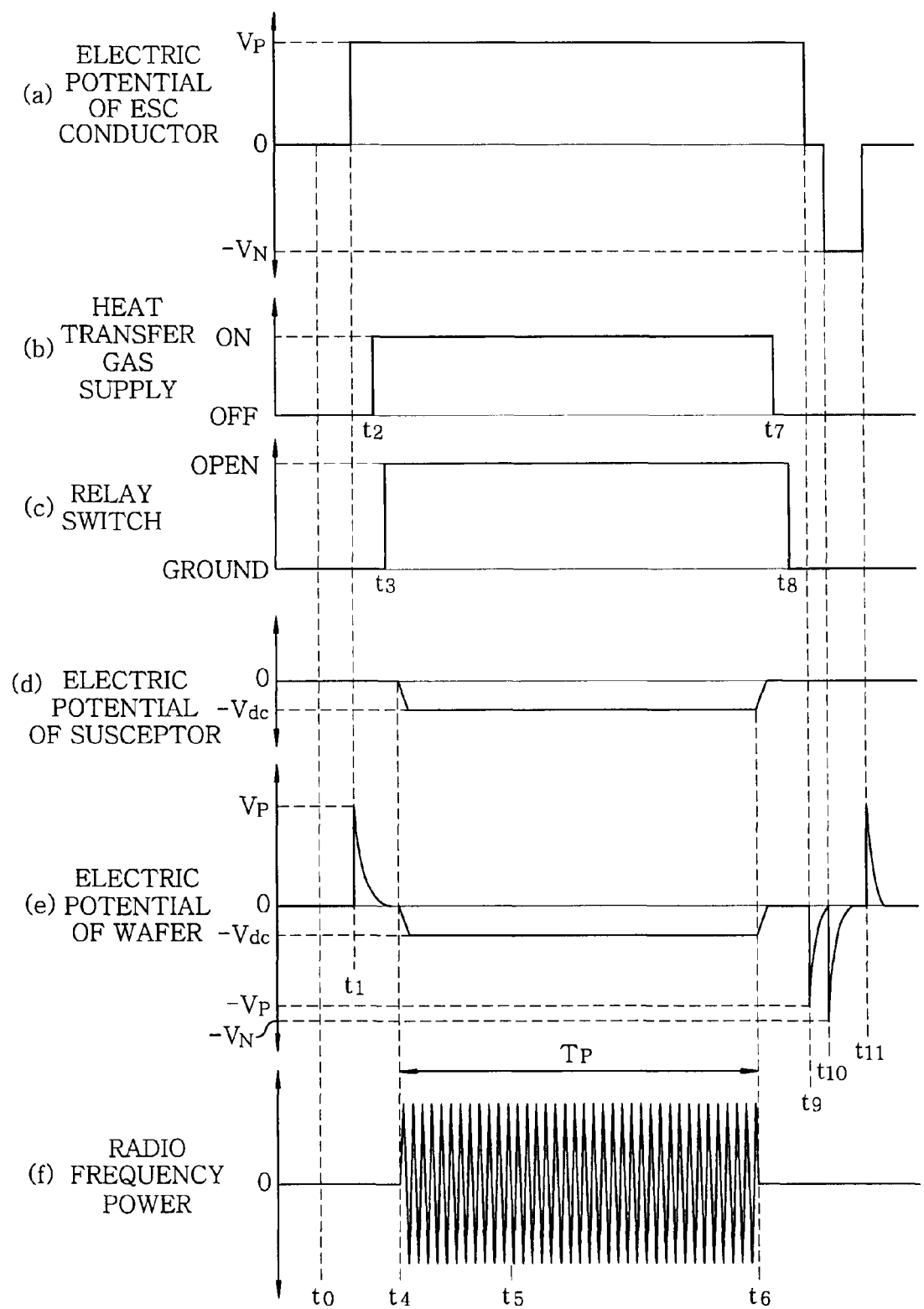
FIG. 3 shows waveform charts (mainly, waveform charts of electric potential) for the respective parts of the apparatus during the first sheet processing process performed by the plasma etching apparatus of the present embodiment.

FIG. 3 shows waveform charts (mainly, waveform charts of electric potential) for the respective parts of the apparatus during the first single substrate process performed by the plasma etching apparatus of the present embodiment. Hereinafter, the major operations of the plasma etching apparatus will be described with reference to FIG. 3 and FIGS. 4A through 4I (equivalent circuit diagrams).

Prior to starting the plasma etching process, the state available at the time point to in FIG. 3 is maintained before and after the semiconductor wafer W is loaded into the chamber 10. More specifically, the selector switch 50 is switched to the ground potential terminal 48 so that the electric potential of the ESC conductor 42 of the electrostatic chuck 38 can be kept at the ground potential or 0 volt (see "(a)" in FIG. 3). The supply of a heat-transferring He gas is stopped or kept in an off-state (see "(b)" in FIG. 3). The relay switch 35 is kept in an on-state or a closed state (see "(c)" in FIG. 3). The electric potential of the susceptor 12 is maintained at the ground potential or 0 volt (see "(d)" in FIG. 3). The RF power supplies 28 and 96 are kept in an off-state (see "(f)" in FIG. 3). The processing gas supply unit 92 ceases to supply a processing gas. The exhaust device 24 is in operation so that the pressure (vacuum pressure) within the chamber 10 can be kept at the value preset for standby purposes.

Figure 4A:
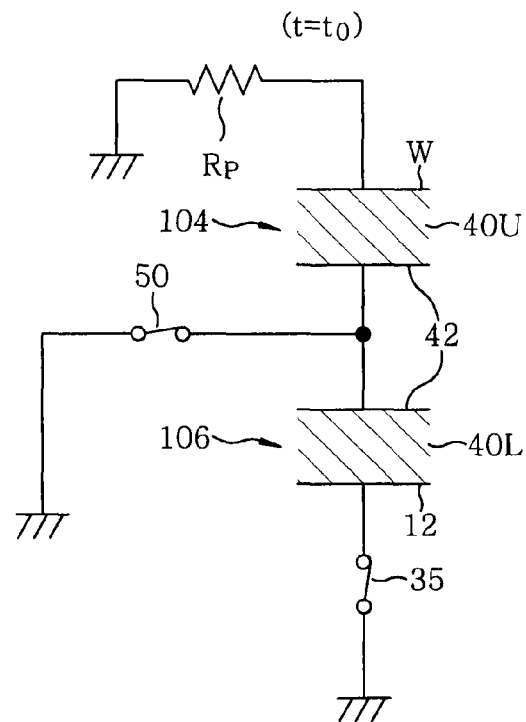
FIGS. 4A to 4I are circuit diagrams illustrating equivalent circuits established around the electrostatic chuck at a specific time point in FIG. 3.

FIG. 4A illustrates an equivalent circuit established around the electrostatic chuck 38 at the time point to in FIG. 3. In this equivalent circuit, an upper ESC capacitor 104 includes an upper dielectric film 40U (see FIG. 2) which is interposed between the ESC conductor 42 and the semiconductor wafer W, and a lower electrostatic chuck capacitor 106 includes a lower dielectric film 40L (see FIG. 2) interposed between the ESC conductor 42 and the susceptor 12.

In this regard, the semiconductor wafer W is regarded as being electrically connected to the sidewall of the chamber 10, which is kept at the ground potential, through a resistor (hereinafter referred to as a "spatial resistor") $R_p$ mainly formed of a gas present in the processing space S. The spatial resistor $R_p$ is a qualitative one whose resistance value varies indefinitely depending on the pressure. At the time point to in FIG. 3, electric charges are not accumulated in any one of the upper and lower electrostatic chuck capacitors 104 and 106.

Although not shown in FIG. 3, the wafer carrying-in and loading operations are performed before the time point to or before the below-mentioned time point $t_1$ at the latest. The wafer carrying-in operation is performed by opening the gate valve 26, moving a transfer arm (not shown) from a neighboring load lock chamber or a neighboring transfer chamber (not shown) and causing the transfer arm to carry the semiconductor wafer W into the chamber 10. The wafer loading operation is performed by operating the actuator 74, moving the lift pins 66 upwards to receive the semiconductor wafer W from the transfer arm and then moving the lift pins 66 downwards to place the semiconductor wafer W on the susceptor 12, i.e., the electrostatic chuck 38.

At the time point $t_1$ when the wafer carrying-in and loading operations have been completed, the selector switch 50 is switched to the positive direct current power supply 44. The output voltage, i.e., high DC voltage $V_p$ (e.g., 2 kV), of the positive direct current power supply 44 is applied to the ESC conductor 42 through the switch 52 and the high voltage line 52. This enables the electric potential of the ESC conductor 42 to momentarily increase from 0 V to the electric potential of the high DC voltage $V_p$.

Figure 4B:
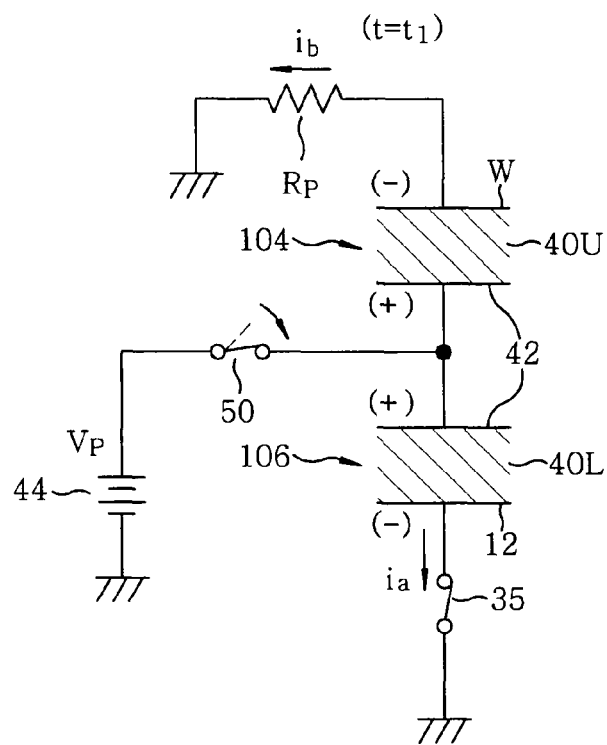

FIG. 4B illustrates an equivalent circuit established around the electrostatic chuck 38 at the time point $t_1$ in FIG. 3. The susceptor 12 is connected to the ground potential terminal through the relay switch 35. Therefore, if a high DC voltage $V_p$ is applied to the ESC conductor 42, a charging current $i_a$ flows instantly through the lower ESC capacitor 106 so that electric charges in the charge quantity of $Q_L (=C_L \times V_p)$ can be momentarily accumulated in the lower ESC capacitor 106. In this connection, the "$C_L$" denotes the capacitance of the lower ESC capacitor 106. Although a voltage equal to the high DC voltage $V_p$ is applied to the lower dielectric film 40L (see FIG. 2), there is no possibility that the lower dielectric film 40L undergoes dielectric breakdown.

In the meantime, a charging current $i_b$ flows exponentially toward the upper ESC capacitor 104 through the spatial resistor $R_p$ at a CR time constant. Assuming that the capacitance of the upper ESC capacitor 104 is denoted by "$C_U$", electric charges in the charge quantity of $Q_U (=C_U \times V_p)$ are accumulated in the upper ESC capacitor 104. In this case, as can be seen from "(e)" in FIG. 3, the electric potential of the semiconductor wafer W is first increased to a value substantially equal to the high DC voltage $V_p$ and then exponentially decreased from that value to the ground potential (0 V) at a CR time constant. Although a voltage substantially equal to the high DC voltage $V_p$ is instantly applied to the upper dielectric film 40U (see FIG. 2), there is no possibility that the upper dielectric film 40U undergoes dielectric breakdown.

Then, the heat transfer gas supply unit is turned on at the time point $t_2$ just after the time point $t_1$ to start the supply of He gas (see "(b)" in FIG. 3). Immediately thereafter and at the time point $t_3$, the relay switch 35 is switched from the on-state (closed state) to an off-state (open state).

Figure 4C:
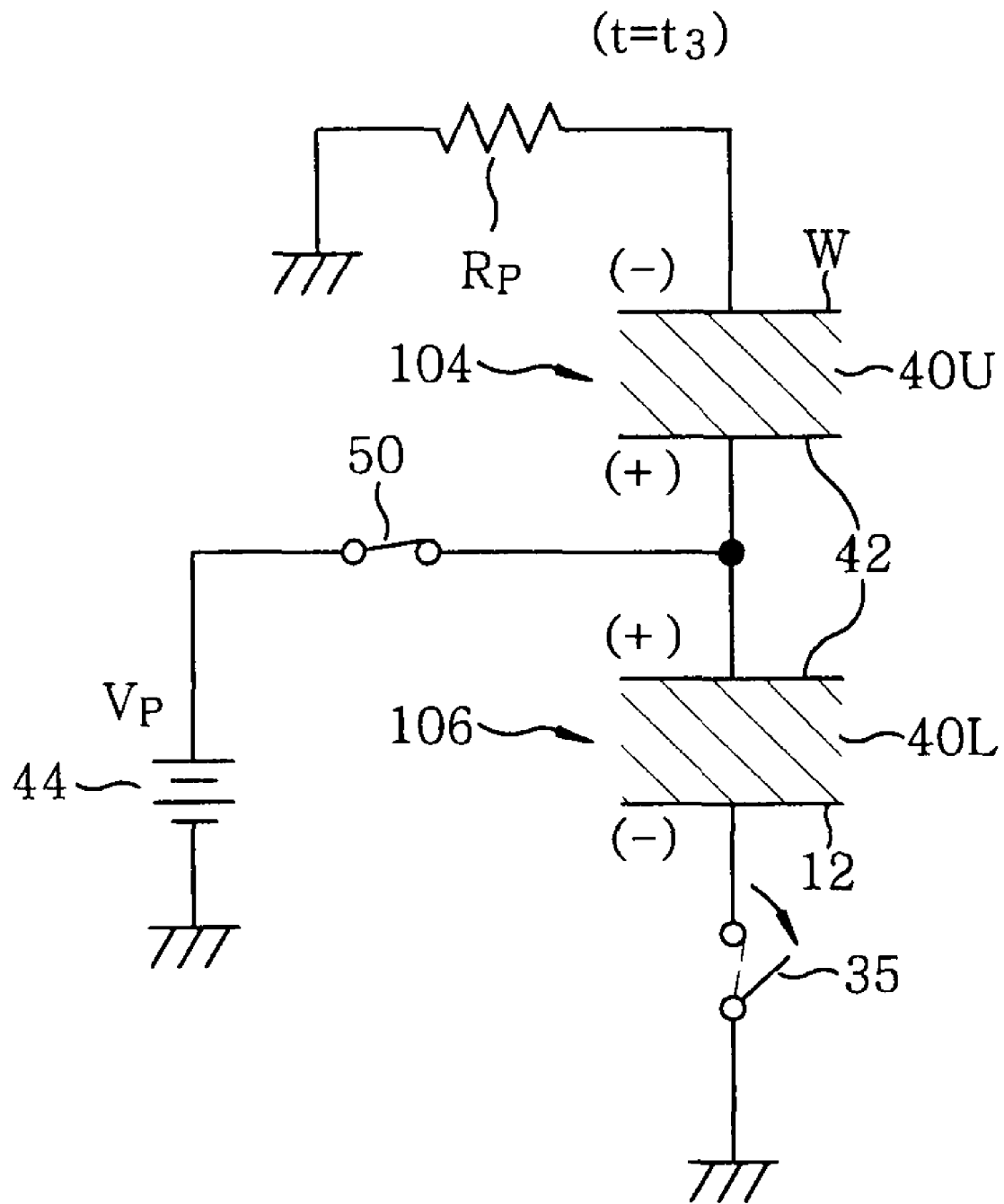

FIG. 4C illustrates an equivalent circuit established around the electrostatic chuck 38 at the time point $t_3$ in FIG. 3. At this time point, the susceptor 12 is switched from the grounded state to a floating state. However, the electric potential of the susceptor 12 is maintained at the ground potential (0 V) as before. The electric charges accumulated in the lower ESC capacitor 106 are also kept in the charge quantity of $Q_L$.

The lapsed time or lag time taken between the time (the time point $t_1$) when the high DC voltage $V_p$ begins to be applied to the ESC conductor 42 and the time (the time point $t_3$) when the susceptor 12 is switched from the grounded state to the floating state may be preferably 1 to 10 seconds and more preferably 3 to 4 seconds.

Then, at the time point $t_4$ just after the time point $t_3$, the RF power supplies 96 and 28 are simultaneously turned on to output RF powers $RF_H$ and $RF_L$ (see "(f)" in FIG. 3). Simultaneously with the time point $t_4$ or before or after the time point $t_4$, the processing gas supply unit begins to supply a processing gas, i.e., an etching gas. The exhaust device 24 is operated to evacuate the chamber 10 so that the pressure (vacuum pressure) within the chamber 10 can be equal to a preset processing value. The etching gas is introduced from the shower head 82 into the processing space S of the chamber 10 and is converted into plasma by RF discharge. Radicals or ions present in the plasma pass through a resist mask coated on the surface of the semiconductor wafer W and react with a film to be processed. Thus, the film to be processed is etched in a desired pattern.

In this plasma etching process, the RF power $RF_H$ of relatively high frequency (40 MHz or more) applied from the RF power supply 96 to the shower head (upper electrode) 82 contribute primarily to the electrical discharge of the etching gas or the generation of the plasma. The RF power $RF_L$ of relatively low frequency (13.56 MHz or less) applied from the RF power supply 28 to the susceptor (lower electrode) 12 contribute predominantly to the attraction of ions from the plasma to the semiconductor wafer W.

During the plasma etching process, namely during the generation of plasma in the processing space S, an upper ion sheath $SH_U$ is formed between the bulk plasma PR and the shower head (upper electrode) 82 and a lower ion sheath $SH_L$ is formed between the bulk plasma PR and the susceptor (lower electrode) 12. A negative upper self-biasing voltage $-v_{dc}$ substantially equal to the voltage drop in the upper ion sheath $SH_U$ is generated in the shower head 82 and a negative lower self-biasing voltage $-V_{dc}$ substantially equal to the voltage drop in the lower ion sheath $SH_L$ is generated in the susceptor 12 and the semiconductor wafer W (see "(d)" and "(e)" in FIG. 3).

Figure 4D:
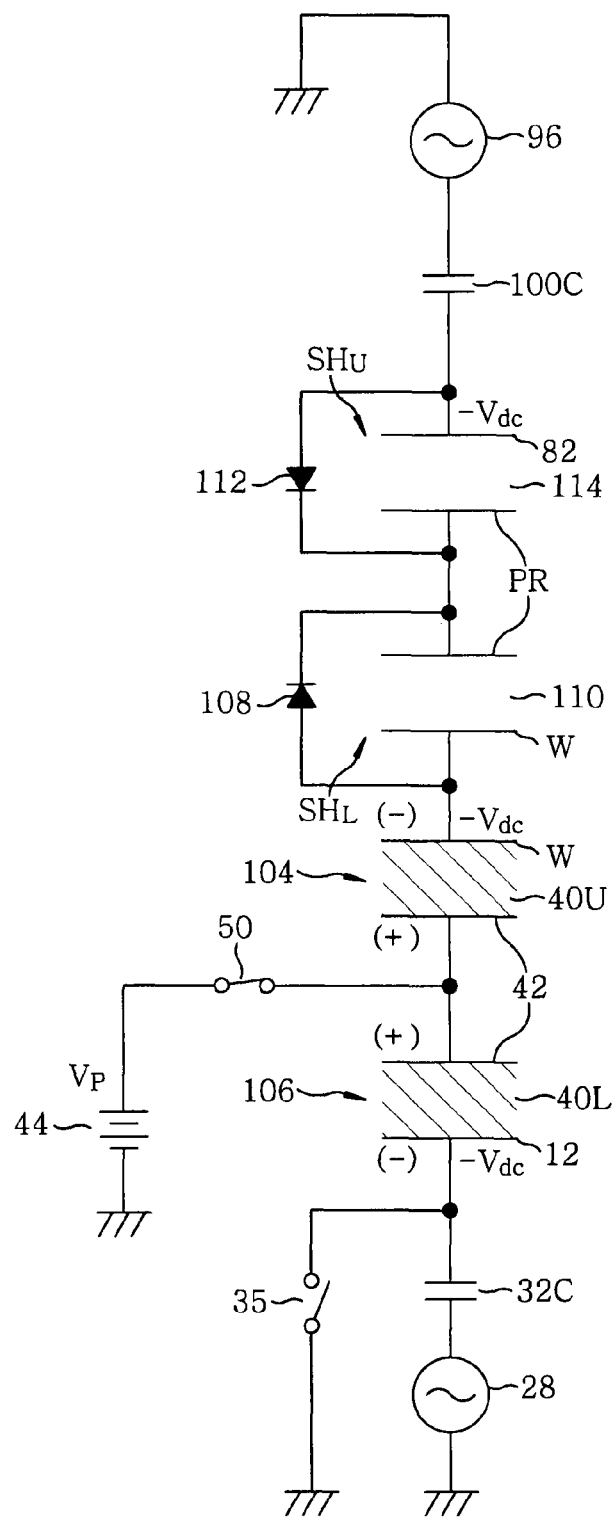

FIG. 4D illustrates an equivalent circuit established around the electrostatic chuck 38 at an arbitrary time point $t_5$ during the plasma etching period TP. In this equivalent circuit, a lower blocking capacitor 32C is included in the lower matching unit 32, which means that the voltage charged in the capacitor 32C becomes a lower self-biasing voltage $-V_{dc}$. In addition, an upper blocking capacitor 100C is included in the upper matching unit 100, which means that the voltage charged in the capacitor 100C becomes an upper self-biasing voltage $-v_{dc}$.

The lower ion sheath $SH_L$ can be represented by a parallel circuit including a diode 108 and a capacitor 110. In this regard, the diode 108 indicates a state that an electron current flows from the plasma to the lower electrode at the moment when the electric potential of the susceptor (lower electrode) 12 comes closer to that of the plasma in each cycle of the RF power $RF_L$. The capacitor 110 indicates a state that the electric charge density on the surface of the lower electrode or the dielectric flux within the lower ion sheath $SH_L$ is changed over time depending on the time-dependent change of the $RF_L$ voltage in each cycle of the RF power $RF_L$, namely a state that a displacement current flows. Similarly, the upper ion sheath $SH_U$ can be represented by a parallel circuit including a diode 112 and a capacitor 114.

As set forth above, the DC characteristics available around the electrostatic chuck 38 and the AC characteristics inherent in the RF powers $RF_L$ and $RF_H$ are overlapped in the equivalent circuit established during the plasma etching period TP.

If the plasma etching period TP comes to an end, the RF power supplies 28 and 96 are simultaneously turned off at that time, namely at the time point $t_6$ in FIG. 3, so that the RF powers $RF_L$ and $RF_H$ (see "(f)" in FIG. 3) stop outputting. Simultaneously with the time point $t_6$ or before or after that time, the processing gas supply unit 92 ceases to supply the processing gas (etching gas). This extinguishes the plasma in the processing space S, thereby stopping the plasma etching process. If the plasma is extinguished, the upper self-bias voltage $-v_{dc}$ and the lower self-bias voltage $-V_{dc}$ disappear. Consequently, the electric potentials of the susceptor 12 and the semiconductor wafer W are restored to the ground potential (0 V) or so (see "(d)" and "(e)" in FIG. 3).

Figure 4E:
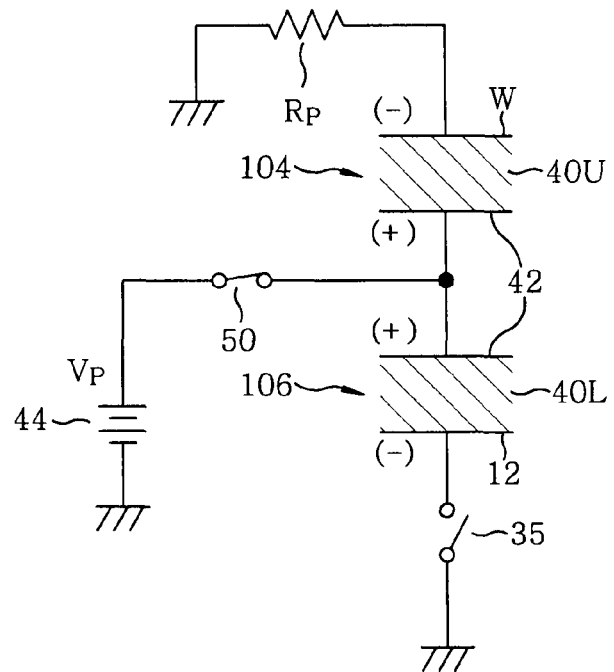

FIG. 4E illustrates an equivalent circuit established around the electrostatic chuck 38 at the time point $t_6$ when the plasma etching process is stopped. As shown, the DC state is restored which is substantially the same as the state available just before starting the plasma etching process (see FIG. 4C).

If the plasma etching process is stopped in the afore-mentioned manner, the heat transfer gas supply unit is turned off immediately thereafter, namely at the time point $t_7$, to stop supplying the He gas (see "(b)" in FIG. 3). Just thereafter and at the time point $t_8$, the relay switch 35 is switched from the off-state (open state) to an on-state (closed state) (see "(c)" in FIG. 3).

Figure 4F:
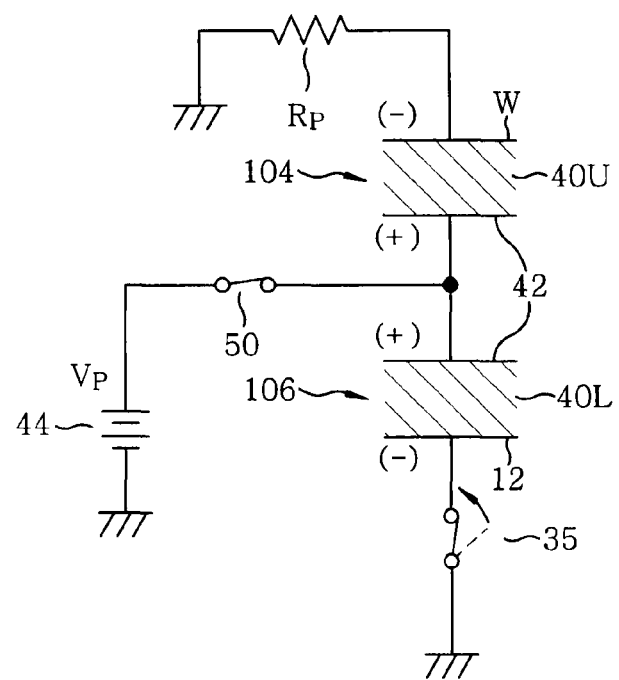

FIG. 4F illustrates an equivalent circuit established around the electrostatic chuck 38 at the time point $t_8$. Since the electric potential of the susceptor 12 is restored to the ground potential (0 V), little electric current flows through the relay switch 35. Thus, the electric charges charged in the lower ESC capacitor 106 are kept as they are.

Once the susceptor 12 is grounded through the relay switch 35 as noted above, the selector switch 50 is switched to the ground potential terminal 48 just thereafter, namely at the time point $t_9$. The ESC conductor 42 is brought into a grounded state (see "(a)" in FIG. 3).

Figure 4G:
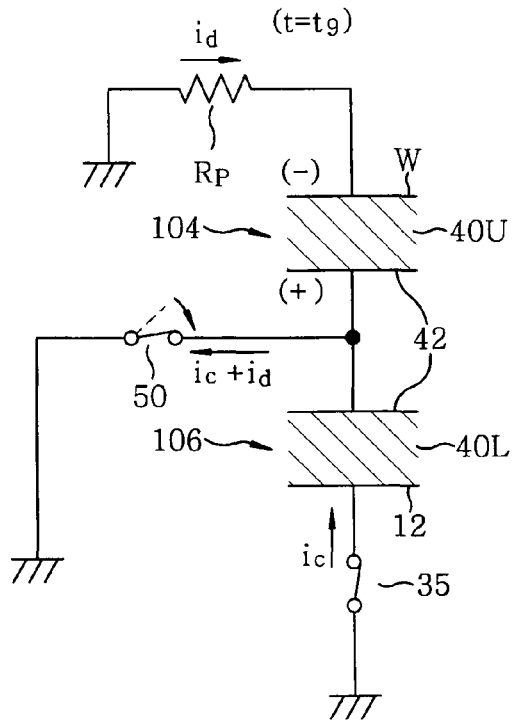

FIG. 4G illustrates an equivalent circuit established around the ESC 38 at the time point $t_9$. The ESC conductor 42 and the susceptor 12 are electrically short-circuited via the selector switch 50 and a ground line. Thus, the lower ESC capacitor 106 is discharged to instantly lose all the electric charges accumulated until that time. In addition, the ESC conductor 42 and the semiconductor wafer W are electrically short-circuited via the selector switch 50, the ground line and the spatial resistor $R_p$. Thus, the upper ESC capacitor 104 is also discharged to exponentially lose the electric charges accumulated therein.

Figure 4H:
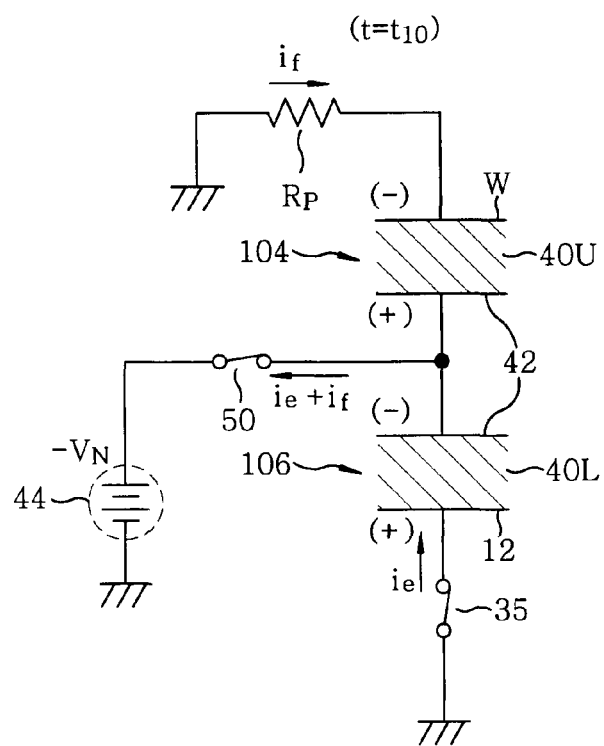

In the present embodiment, the selector switch 50 is switched to the negative direct current power supply 46 just after the time point $t_9$, namely at the time point too. A negative high DC voltage $-V_N$ (of, e.g., $-3$ kV) is applied to the ESC conductor 42 (see "(a)" in FIG. 3). This further accelerates the discharge of the upper ESC capacitor 104. A charging current i.e. flows through the lower ESC capacitor 106 in the reverse direction. Thus, negative electric charges in the charge quantity of $-Q_L$ ($=C_L \times V_N$) are momentarily accumulated in the lower ESC capacitor 106. Although the high DC voltage $-V_N$ is applied to the lower dielectric film 40L (see FIG. 2), there is no possibility that the lower dielectric film 40L undergoes dielectric breakdown. Illustrated in FIG. 4H is an equivalent circuit established around the ESC 38 at the time point $t_{10}$.

The lapsed time or lag time taken between the time (the time point $t_8$) when the susceptor 12 is switched from the floating state to the grounded state and the time (the time point $t_9$) when the application of the high DC voltage $V_p$ to the ESC conductor 42 is stopped may be preferably 0.1 to 5 seconds and more preferably 1 to 2 seconds.

Figure 4I:
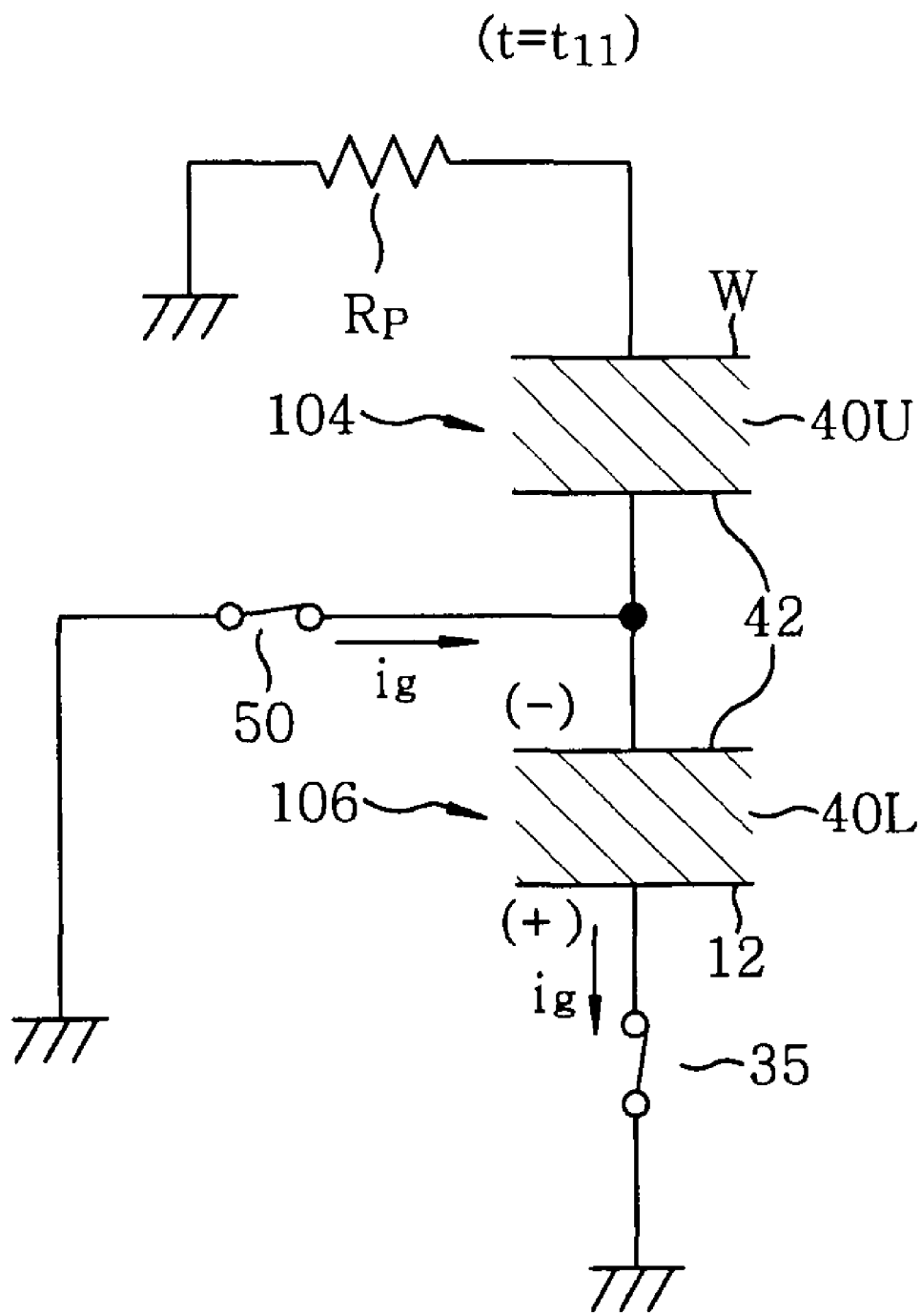

At the time point $t_{11}$ immediately after the time point $t_{10}$, the selector switch 50 is switched to the ground potential terminal 48 so that the ESC conductor 42 reset to the grounded state (see "(a)" in FIG. 3). In response, the ESC conductor 42 and the susceptor 12 are electrically short-circuited via the selector switch 50 and the ground line. Thus, the lower ESC capacitor 106 is discharged to instantly lose all the electric charges accumulated until that time. In addition, the ESC conductor 42 and the semiconductor wafer W are electrically short-circuited via the selector switch 50, the ground line and the spatial resistor $R_p$. Thus, the electric charges of the upper ESC capacitor 104 are almost completely eliminated. In other words, the electric charges are almost completely removed from the semiconductor wafer W. Illustrated in FIG. 4I is an equivalent circuit established around the electrostatic chuck 38 at the time point $t_{11}$.

Although not shown in FIG. 3, the semiconductor wafer W is unloaded and carried out after the time point $t_{11}$. The unloading operation is performed by operating the actuator 74 and moving the lift pins 66 upwards to horizontally lift up the semiconductor wafer W away from the susceptor 12.

No electrostatic attracting force (Coulomb force) is generated at that time, because the electric charges have been completely removed from the semiconductor wafer W as mentioned above. This makes it possible to easily separate the semiconductor wafer W from the ESC 38. The wafer carrying-out operation is performed by opening the gate valve 26, moving the transfer arm (not shown) from the neighboring load lock chamber or the neighboring transfer chamber (not shown), transferring the semiconductor wafer W to the transfer arm and causing the transfer arm to carry the semiconductor wafer W out of the chamber 10.

With the plasma etching apparatus of the present embodiment described above, there is substantially no possibility that a high DC voltage (of several kilovolts) equivalent to the high DC voltage $V_p$ or $-V_N$ is developed between the semiconductor wafer W and the susceptor 12 when the high DC voltage $V_p$ or $-V_N$ is applied to the ESC 38 during the first sheet plasma etching process. This eliminates that abnormal electric discharge occurs in the gas spaces 62, 64, 70 and 68 defined between the semiconductor wafer W and the susceptor 12. Therefore, the plasma etching process is completed without causing damage to the semiconductor wafer W, which would otherwise occur by abnormal electric discharge. This makes it possible to improve the yield rate in the plasma etching process.

If the high DC voltage $V_p$ is applied to the ESC conductor 42 at the time point $t_1$, the electric potential of the semiconductor wafer W is increased by electrostatic induction from the ground potential (0 V) to a level equal to the high DC voltage $V_p$, with the susceptor 12 kept at the ground potential (0 V). However, the electric potential thus increased is nothing more than a peak value sustaining at an extremely short moment and is instantly restored to the ground potential (0V), thus causing no abnormal electric discharge.

Similarly, the susceptor 12 is kept at the ground potential (0 V) even when the electric potential of the ESC conductor 42 is changed from $V_p$ to 0 V at the time point $t_9$, from 0 V to $-V_N$ at the time point too and from $-V_N$ to 0 V at the time point $t_{11}$. At these time points, the electric potential of the semiconductor wafer W is decreased (or increased) by electrostatic induction from the ground potential (0 V) to a level substantially equal to the high DC voltage $-V_p$, $-V_N$ or $V_p$. However, the electric potential thus decreased (or increased) is nothing more than a peak value sustaining at an extremely short moment and is instantly restored to the ground potential (0V), thus causing no abnormal electric discharge.

COMPARATIVE EXAMPLE

FIG. 5 shows the sequence of a comparative example in which the switching timing of the relay switch 35 differs from that of the foregoing embodiment. In this comparative example, the relay switch 35 is first switched from the on-state (closed state) to an off-state (open state) at the time point to immediately before starting the plasma etching process (see "(c)" in FIG. 5). At the time point $t_1$ just thereafter, the selector switch 50 is switched from the ground potential terminal 48 to the positive direct current power supply 44. The electric potential of the ESC conductor 42 is increased from the ground potential to an electric potential equal to the high DC voltage $V_p$ (see "(a)" in FIG. 5).

In this case, if the electric potential of the ESC conductor 42 is increased from the ground potential to the electric potential of the high DC voltage $V_p$, the electric potentials of the susceptor 12 and the semiconductor wafer W are also simultaneously increased by electrostatic induction from the ground potential to the electric potential of the high DC voltage $V_p$ at a moment (see "(d)" and "(e)" in FIG. 5). Immediately thereafter, the positive electric charges of static electricity flow out from the semiconductor wafer W to the sidewall of the chamber 10 through the spatial resistor $R_p$. Thus, the electric potential of the semiconductor wafer W is decreased exponentially (see "(e)" in FIG. 5). On the other hand, the positive electric charges of static electricity do not flow out from the susceptor 12 and remain as they are. Thus, the electric potential of the susceptor 12 is kept at the electric potential of the high DC voltage $V_p$ (see "(d)" in FIG. 5). Therefore, at the time when the electric potential of the semiconductor wafer W is decreased to the ground potential or so, namely at the time point $t_a$ shown in FIG. 5, a voltage substantially equal to the high DC voltage $V_p$ is applied to the gas spaces 62, 64, 70 and 68 between the semiconductor wafer W and the susceptor 12. Although this does not always trigger abnormal electric discharge in the gas spaces 62, 64, 70 and 68, it becomes likely that abnormal electric discharge occurs if the discharge-starting conditions under Paschen's Law are satisfied depending on the pressure at that time. Once the abnormal electric discharge occurs, a discharging current will flow from that place to the sidewall of the chamber 10 through the semiconductor wafer W, consequently causing damage to the semiconductor wafer W.

The inner wall of each of the through-holes 68 formed in the susceptor 12 to permit passage of the lift pins 66 is covered with the insulating body 80. However, it is sometimes the case that electric discharge occurs through the gap 120 formed in the contact interfacial surfaces of the upper end of the inner wall (see FIG. 2).

In the comparative example, the ESC conductor 42 and the susceptor 12 are all kept at the electric potential of the high DC voltage $V_p$ at the time point $t_6$ when the plasma etching process comes to an end (see "(a)" and "(d)" in FIG. 5). At the time point $t_9$, the selector switch 50 is first switched from the positive direct current power supply 44 to the ground potential terminal 48 and, then, the electric potential of the ESC conductor 42 is drawn down from the high DC voltage $V_p$ to the ground potential (see "(a)" in FIG. 5).

In this case, if the electric potential of the ESC conductor 42 is decreased from the high DC voltage $V_p$ to the ground potential, the electric potential of the susceptor 12 is also simultaneously decreased by electrostatic induction from the high DC voltage $V_p$ to the ground potential (see "(d)" in FIG.

5) and the electric potential of the semiconductor wafer W is decreased from the ground potential to the electric potential of $-V_p$ (see "(e)" in FIG. 5). Immediately thereafter, the negative electric charges of static electricity flow out from the semiconductor wafer W to the sidewall of the chamber 10 through the spatial resistor $R_p$. Thus, the electric potential of the semiconductor wafer W is exponentially increased and restored to the ground potential.

At the time point too, the selector switch 50 is switched from the ground potential terminal 48 to the negative direct current power supply 46 and the electric potential of the ESC conductor 42 is drawn down from the ground potential to the electric potential of $-V_N$ (see "(a)" in FIG. 5). Then, the electric potential of the susceptor 12 is also decreased by electrostatic induction from the ground potential to the electric potential of $-V_N$ (see "(d)" in FIG. 5) and the electric potential of the semiconductor wafer W is decreased by electrostatic induction from the near ground potential to the electric potential of $-V_N$ (see "(e)" in FIG. 5). Immediately thereafter, the negative electric charges of static electricity flow out from the semiconductor wafer W to the sidewall of the chamber 10 through the spatial resistor $R_p$. Thus, the electric potential of the semiconductor wafer W is exponentially increased and restored to the ground potential. On the other hand, the susceptor 12 is in a floating state, for the reason of which the electric charges of static electricity do not flow out from the susceptor 12 and stays as they are. Thus, the electric potential of the susceptor 12 is kept at the electric potential of $-V_N$. At the time when the electric potential of the semiconductor wafer W is decreased to the ground potential or so, namely at around the time point $t_b$ in FIG. 5, a voltage substantially equal to the high DC voltage $-V_N$ is applied to the gas spaces 62, 64, 70 and 68 between the semiconductor wafer W and the susceptor 12. Although this does not always trigger abnormal electric discharge in the gas spaces 62, 64, 70 and 68, it becomes likely that abnormal electric discharge occurs if the discharge-starting conditions under Paschen's Law are satisfied depending on the pressure at that time.

In this comparative example, the selector switch 50 is switched from the negative direct current power supply 46 to the ground potential terminal 48 at the time point $t_{11}$ and the electric potential of the ESC conductor 42 is restored from $-V_N$ to the ground potential (see "(a)" in FIG. 5). Immediately thereafter, at the time point 12, the relay switch 35 is switched from the ongoing off-state (or the ongoing open state) to an on-state (or a closed state) (see "(c)" in FIG. 5).

In the comparative example as set forth above, if abnormal electric discharge occurs actually in the gas spaces 62, 64, 70 and 68 between the semiconductor wafer W and the susceptor 12 at around the time point $t_a$ immediately before starting the plasma etching process, there is a problem in that the probability of occurrence of the abnormal electric discharge is sharply increased at the time point $t_b$ immediately after termination of the plasma etching process.

More specifically, if the abnormal electric discharge occurs actually at around the time point $t_a$ as shown in FIG. 6, the static electricity is drained and removed from the susceptor 12. Thus, the electric potential of the susceptor 12 is decreased to the ground potential even though the susceptor 12 is in a floating state (see "(d)" in FIG. 6). For that reason, if the selector switch 50 is switched from the positive direct current power supply 44 to the ground potential terminal 48 at the time point $t_9$ and if the electric potential of the ESC conductor 42 is drawn down from $V_p$ to the ground potential (see "(a)" in FIG. 6), the electric potential of the susceptor 12 is decreased by electrostatic induction from the ground potential to $-V_p$ (see "(d)" in FIG. 6) and the electric potential of the semiconductor wafer W is decreased by electrostatic induction from the near ground potential to $-V_p$ (see "(e)" in FIG. 6). Immediately thereafter, the negative electric charges of static electricity flow out from the semiconductor wafer W to the sidewall of the chamber 10 through the spatial resistor $R_p$. Thus, the electric potential of the semiconductor wafer W is exponentially increased and restored to the ground potential. On the other hand, the susceptor 12 is in a floating state, for the reason of which the electric charges of static electricity do not flow out from the susceptor 12 and stays as they are. Thus, the electric potential of the susceptor 12 is kept at the electric potential of $-V_p$. At the time when the electric potential of the semiconductor wafer W is increased to the ground potential or so, namely just before the time point $t_{10}$ in FIG. 6, a voltage substantially equal to the high DC voltage $-V_p$ is applied to the gas spaces 62, 64, 70 and 68 between the semiconductor wafer W and the susceptor 12. In this case, it is highly likely that abnormal electric discharge occurs again.

However, the possibility of recurrence of the abnormal electric discharge is decisively high at around the time point $t_b$ immediately after the selector switch 50 is switched from the ground potential terminal 48 to the negative direct current power supply 46 and the electric potential of the ESC conductor 42 is drawn down from the ground potential to $-V_N$. More specifically, if the electric potential of the ESC conductor 42 is decreased from the ground potential to $-V_N$, the electric potential of the susceptor 12 is further decreased from $-V_p$ in the amount of $-V_N$ by electrostatic induction, thus reaching a level of $-(V_p+V_N)$. On the other hand, the negative electric charges of static electricity flow out from the semiconductor wafer W to the sidewall of the chamber 10 through the spatial resistor $R_p$. Thus, the electric potential of the semiconductor wafer W is exponentially increased and restored to the ground potential. In response, a voltage of $(V_p+V_N)$ is applied to the gas spaces 62, 64, 70 and 68 between the semiconductor wafer W and the susceptor 12 at around the time point $t_b$. Since electric discharge is performed at the applied voltage of $V_p$ immediately after starting the process, it is almost sure that abnormal electric discharge occurs again at the applied voltage of $(V_p+V_N)$. This causes fatal damage to the semiconductor wafer W.

OTHER EMBODIMENTS

While one preferred embodiment of the present invention has been described hereinabove, the present invention shall not be limited thereto but may be modified in many different forms.

For example, although the negative direct current voltage $-V_N$ is applied to the ESC conductor 42 in the foregoing embodiment to remove electricity from the semiconductor wafer W within a short period of time after termination of the plasma etching process, it may be possible to omit the application of the negative direct current voltage $-V_N$ (namely, the provision of the negative direct current power supply 46) if there is no need to shorten the electricity removal time.

The plasma processing method and apparatus of the present invention is not limited to the upper-and-lower plate dual frequency application type as employed in the foregoing embodiment in which RF power for the generation of plasma is applied to the upper electrode and RF power for the attraction of ions is applied to the lower electrode. As an alternative example, it may be possible to employ a lower two RF power application type in which two kinds of RF powers are overlappingly applied to the susceptor (or the lower electrode) or a single-frequency-wave application type in which one kind of RF power is applied to the susceptor (or the lower electrode).

The forgoing embodiment involves a capacitively coupled plasma processing apparatus that generates plasma through the use of RF discharge occurring between parallel plate electrodes within a chamber. However, the present invention is equally applicable to an inductively coupled plasma processing apparatus in which an antenna is arranged on the upper surface or the vicinity of a chamber to generate plasma under the presence of dielectric magnetic fields or a microwave plasma processing apparatus that generates plasma through the use of microwave power.

The present invention is not limited to the plasma etching apparatus but may be applied to other plasma processing apparatuses for performing plasma CVD, plasma oxidizing, plasma nitrifying, sputtering or the like. Furthermore, the target substrate usable in the present invention is not limited to the semiconductor wafer. It may be possible to use various kinds of substrates for use in a flat panel display, a photo mask, a CD substrate, a printed board and so forth.

While the invention has been shown and described with respect to the embodiments, it will be understood by those skilled in the art that various changes and modification may be made without departing from the scope of the invention as defined in the following claims.

What is claimed is:

1. A plasma processing method for holding a target substrate on a first electrode with an electrostatic attracting force within an evacuatable processing chamber by use of an electrostatic chuck provided in the first electrode and applying a first radio frequency (RF) power to the first electrode to perform desired plasma processing on the substrate, the electrostatic chuck including a dielectric film and a conductor encapsulated within the dielectric film, the method comprising:
   electrically grounding the conductor of the electrostatic chuck and the first electrode prior to starting the plasma processing;
   loading the substrate on the first electrode by operating a lift pin movable through the first electrode and the electrostatic chuck;
   starting application of a first direct current voltage with a first polarity to the conductor of the electrostatic chuck at a first time point after loading the substrate on the first electrode;
   switching the first electrode from an electrically grounded state to an electrically floating state at a second time point subsequent to the first time point;
   starting application of the first RF power to the first electrode at a third time point subsequent to the second time point;
   stopping application of the first RF power to the first electrode at a fourth time point after a specified time has lapsed from the third time point;
   switching the first electrode from the electrically floating state to the electrically grounded state at a fifth time point subsequent to the fourth time point;
   stopping application of the first direct current voltage to the conductor of the electrostatic chuck and restoring the conductor to a ground potential at a sixth time point subsequent to the fifth time point; and
   unloading the substrate from the first electrode by operating the lift pin at a seventh time point subsequent to the sixth time point.

2. The plasma processing method of claim 1, wherein the time interval from the first time point to the second time point is set equal to about 1 to 10 seconds.

3. The plasma processing method of claim 1, wherein the time interval from the fifth time point to the sixth time point is set equal to about 0.1 to 5 seconds.

4. The plasma processing method of claim 1, wherein an operation of supplying a heat transfer gas to a back surface of the substrate through gas passages respectively formed in the first electrode and the electrostatic chuck to transfer the temperature of the first electrode to the substrate is started between the first time point and the second time point and is stopped between the fourth time point and the fifth time point.

5. The plasma processing method of claim 1, wherein a second direct current voltage with a second polarity opposite to the first polarity is applied to the conductor of the electrostatic chuck between the sixth time point and the seventh time point to rapidly remove static electricity from the substrate within a shortened period of time, after which the substrate is restored to a ground potential.

6. The plasma processing method of claim 1, wherein the plasma processing is performed by introducing a desired processing gas into the processing chamber, electrically discharging the processing gas to generate plasma and allowing ions or radicals present in the plasma to make a specified chemical reaction.

7. The plasma processing method of claim 6, wherein the first RF power contributes mainly to generation of the plasma from the processing gas.

8. The plasma processing method of claim 6, wherein the first RF power contributes mainly to attraction of the ions from the plasma to the substrate.

9. The plasma processing method of claim 8, wherein a second electrode opposing the first electrode in a parallel relationship therewith is provided within the processing chamber and wherein a second RF power contributing mainly to generation of the plasma from the processing gas is applied to the second electrode between the third time point and the fourth time point.

10. The plasma processing method of claim 1, wherein a second RF power differing from the first RF power is applied to the first electrode simultaneously with application of the first RF power.

* * * * *